US008623148B2

(12) United States Patent
Mitchell et al.

(10) Patent No.: US 8,623,148 B2
(45) Date of Patent: Jan. 7, 2014

(54) NF₃ CHAMBER CLEAN ADDITIVE

(75) Inventors: Glenn Mitchell, Longmont, CO (US);
Robert Torres, Jr., Parker, CO (US);
Adam Seymour, Longmont, CO (US)

(73) Assignee: Matheson Tri-Gas, Inc., Basking Ridge, NJ (US)

( * ) Notice: Subject to any disclaimer, the term of this patent is extended or adjusted under 35 U.S.C. 154(b) by 504 days.

(21) Appl. No.: 12/878,195

(22) Filed: Sep. 9, 2010

(65) Prior Publication Data
US 2011/0056515 A1    Mar. 10, 2011

Related U.S. Application Data

(60) Provisional application No. 61/241,287, filed on Sep. 10, 2009.

(51) Int. Cl.
B08B 9/00    (2006.01)

(52) U.S. Cl.
USPC ............... 134/22.1; 134/1.1; 134/22.16; 15/1

(58) Field of Classification Search
None
See application file for complete search history.

(56) References Cited

U.S. PATENT DOCUMENTS

| | | | |
|---|---|---|---|
| 4,158,678 A | 6/1979 | Tatemoto et al. | |
| 4,243,770 A | 1/1981 | Tatemoto et al. | |
| 4,530,972 A | 7/1985 | Tatemoto et al. | |
| 5,173,553 A | 12/1992 | Albano et al. | |
| 5,770,098 A | 6/1998 | Araki et al. | |
| 6,074,888 A | 6/2000 | Tran et al. | |
| 6,613,691 B1 | 9/2003 | Hung et al. | |
| 6,635,229 B1 | 10/2003 | Lee et al. | |
| 6,743,874 B2 | 6/2004 | Harrison et al. | |
| 7,033,954 B2 | 4/2006 | Donohoe | |
| 7,517,804 B2 | 4/2009 | Kiehlbauch et al. | |
| 7,553,543 B2 | 6/2009 | Bekiarian | |
| 7,655,742 B2 | 2/2010 | Araki et al. | |
| 2002/0106460 A1 | 8/2002 | Lee et al. | |
| 2004/0035825 A1 | 2/2004 | Nakamura et al. | |
| 2005/0161060 A1 | 7/2005 | Johnson et al. | |

(Continued)

FOREIGN PATENT DOCUMENTS

| | | |
|---|---|---|
| EP | 0854502 A2 | 7/1998 |
| WO | WO 02/07194 A2 | 1/2002 |
| WO | WO 02/090615 A1 | 11/2002 |

OTHER PUBLICATIONS

Levy et al., "Investigation of CF3I as an environmentally benign dielectric etchant", Journal of Materials Research (online), Sep. 1998, (retrieved Oct. 17, 2010), vol. 13, No. 9, pp. 2643-2648, retrieved from the internet at: http://www.mrs.org/s_mrs/sec_subscribe.asp?CID=2314&DID=79469&action=detail>, abstract.

(Continued)

*Primary Examiner* — Eric Golightly
(74) *Attorney, Agent, or Firm* — Kilpatrick Townsend & Stockton LLP

(57) ABSTRACT

Methods of cleaning a processing chamber with nitrogen trifluoride ($NF_3$) are described. The methods involve a concurrent introduction of nitrogen trifluoride and a reactive diluent into the chamber. The $NF_3$ may be excited in a plasma inside the chamber or in a remote plasma region upstream from the chamber. The reactive diluent may be introduced upstream or downstream of the remote plasma such that both $NF_3$ and the reactive diluent (and any plasma-generated effluents) are present in the chamber during cleaning. The presence of the reactive diluent enhances the chamber-cleaning effectiveness of the $NF_3$.

12 Claims, 5 Drawing Sheets

(56) References Cited

U.S. PATENT DOCUMENTS

| | | |
|---|---|---|
| 2005/0266691 A1 | 12/2005 | Gu et al. |
| 2007/0224829 A1 | 9/2007 | Ji et al. |
| 2008/0131793 A1 | 6/2008 | Lee et al. |
| 2009/0102025 A1 | 4/2009 | Hayashi et al. |
| 2009/0149008 A1 | 6/2009 | Kryliouk et al. |
| 2009/0159560 A1 | 6/2009 | Kiehlbauch et al. |
| 2009/0176375 A1 | 7/2009 | Benson et al. |
| 2009/0191715 A1 | 7/2009 | Hayashi |
| 2010/0055921 A1 | 3/2010 | Mitchell et al. |
| 2010/0093962 A1 | 4/2010 | Araki et al. |
| 2010/0215854 A1 | 8/2010 | Burrows et al. |
| 2010/0273291 A1 | 10/2010 | Kryliouk et al. |
| 2011/0059617 A1 | 3/2011 | Mitchell et al. |
| 2011/0073136 A1 | 3/2011 | Torres, Jr. et al. |
| 2011/0079251 A1 | 4/2011 | Kryliouk et al. |

OTHER PUBLICATIONS

PCT International Search Report and Written Opinion mailed Nov. 16, 2010; International Application No. PCT/US2010/48274, 8 pages.

PCT International Search Report and Written Opinion mailed Oct. 27, 2010; International Application No. PCT/US2010/48270, 9 pages.

Ji, Bing et al., "Fluorine Plasma Chemistry for High-AR Dielectric Etching", Solid State Technology, Nov. 2005, 4 pages.

Karecki et al., "Characterization of iodoheptafluoropropane as a dielectric etchant. I. Process performance evaluation", J. Vac. Sci. Technol. B 19(4), Jul./Aug. 2001, pp. 1269-1292.

Karecki et al., "Characterization of iodoheptafluoropropane as a dielectric etchant. II. Wafer surface analysis", ", J. Vac. Sci. Technol. B 19(4), Jul./Aug. 2001, pp. 1293-1305.

Karecki et al., "Characterization of iodoheptafluoropropane as a dielectric etchant. III. Effluent analysis", ", J. Vac. Sci. Technol. B 19(4), Jul./Aug. 2001, pp. 1306-1318.

Karecki et al., "Plasma etching of dielectric films with novel iodofluorocarbon chemistries: Iodotrifluoroethylene and 1-iodoheptafluoropropane", J. Vac. Sci. Technol. A 16(2), Mar./Apr. 1998, pp. 755-758.

Karecki et al., "Use of 2H-heptafluoopropane, 1-iodoheptafluoropropane, and 2-iodoheptafluoropropane for a high aspect ratio via etch in a high density plasma etch tool", J. Vac. Sci. Technol. A 16(4), Jul./Aug. 1998, pp. 2722-2724.

Karecki, Simon et al., "Use of Novel Hydrofluorocarbon and Iodofluorocarbon Chemistries for a High Aspect Ratio Via Etch in a High Density Plasma Etch Tool", J. Electrochem. Soc., vol. 145, No. 12, Dec. 1998, pp. 4305-4312.

Karecki, Simon M., "Development of Novel Alternative Chemistry Processes for Dielectric Etch Applications", MIT Ph.D. Thesis, Jun. 2000, 402 pages.

Nakamura, S. et al., "Comparative Studies of Perfluorocarbon Alternative Gas Plasmas for Contact Hole Etch", Jpn. J. Appl. Phys., 42 (2003), p. 5759-5764.

Tao, Benjamin, "Non-Perfluorocompound Chemistries for Plasma Etching of Dielectrics", M.S. Dissertation, MIT, 1996, 111 pages.

Welch, S. et al., "Advanced DRAMs Drive High-AR Etch Advances", Semiconductor International, Feb. 2009, pp. 18-22.

NF₃ CHAMBER CLEAN ADDITIVE

CROSS-REFERENCES TO RELATED APPLICATIONS

This application claims the benefit of U.S. Prov. Pat. App. No. 61/241,287 filed Sep. 10, 2009, and titled "ETCH AND CLEAN PROCESSES," which is incorporated herein by reference for all purposes.

BACKGROUND OF THE INVENTION

The semiconductor industry has benefited from in-situ dry cleaning procedures made possible by exciting nitrogen trifluoride in a plasma and flowing the plasma effluents to clean interior surfaces of a substrate processing chamber. In-situ cleaning procedures avoid requiring chamber disassembly while still removing undesired substances such as silicon nitride, polycrystalline silicon, silicides and silicon dioxide. Removing these undesired substances before additional substrate processing may reduce defects and control electromechanical properties of processed layers.

A prior art chamber cleaning procedure is shown in FIG. 1 and begins when nitrogen trifluoride is flowed into a substrate processing chamber (operation 110). A plasma is formed from the nitrogen trifluoride (operation 115) to populate the processing chamber with reactive fragments of the nitrogen trifluoride. The plasma effluents are reacted with contaminants residing on interior surfaces of the chamber (operation 120). The reacted contaminants are then removed from the chamber through the chamber exhaust system (operation 125). The plasma may either reside in the chamber or outside (and upstream from) the chamber.

The relatively high cost of nitrogen trifluoride combined with speculation that the agent has a high global warming potential (GWP), are causing manufacturers to look for ways to use less $NF_3$ per preventative maintenance procedure. Thus there is a need for new chamber cleaning agents which more effectively remove contaminants from the interior surfaces of substrate processing chambers and produce more eco-friendly exhaust gases.

BRIEF SUMMARY OF THE INVENTION

Methods of cleaning a chemical vapor deposition (CVD) chamber with nitrogen trifluoride ($NF_3$) are described. The methods involve a concurrent introduction of nitrogen trifluoride and a reactive diluent into a CVD chamber. The $NF_3$ may be excited in a plasma inside the CVD chamber or in a remote plasma region upstream from the CVD chamber. The reactive diluent may be introduced upstream or downstream of the remote plasma such that both $NF_3$ and the reactive diluent (and any plasma-generated effluents) are present in the CVD chamber during cleaning. The presence of the reactive diluent enhances the chamber-cleaning effectiveness of the $NF_3$ which allows less $NF_3$ to be used and discarded. The reactive diluent may also reduce the ability of the $NF_3$ to reform and therefore, further reduce the quantity of discarded $NF_3$.

Embodiments of the invention include methods of cleaning a CVD chamber with $NF_3$. The methods may include introducing a cleaning mixture to the CVD chamber. The cleaning mixture comprises the $NF_3$ or reactive species generated from the NF3 as well as a reactive diluent. The methods may further include reacting a first fluorine-containing species generated from the NF3 with a contaminant in the CVD chamber. The reacted contaminant is removed from the CVD chamber. The methods may further include forming a non-$NF_3$ emission product from a reaction of the reactive diluent with a second fluorine-containing species generated from the $NF_3$. The formation of the non-$NF_3$ emission product reduces the formation of $NF_3$ from the CVD chamber cleaning process.

Embodiments may also include methods of cleaning a CVD chamber with $NF_3$. The method may include introducing a cleaning mixture to the CVD chamber, wherein the cleaning mixture comprises the $NF_3$ or reactive species generated from the $NF_3$ and a replacement compound selected from the group consisting of $COF_2$, $IF_5$, $F_2$, $NCl_2F$, $NI_2F$, $(CH_3)_2NF$, $(CF_3)_2NF$, $NOF_2$, $BrF_3$, $IF$, and $ClF$ to the CVD chamber. The methods may further include reacting the cleaning mixture and the replacement compound with a contaminant in the CVD chamber to form a reacted contaminant which is removed from the CVD chamber. A presence of the replacement compound results in less $NF_3$ exhausted from the CVD chamber following reaction with the contaminant.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Methods of cleaning a process chamber with nitrogen trifluoride ($NF_3$) are described. The methods involve a concurrent introduction of nitrogen trifluoride and a reactive diluent into a process chamber. The $NF_3$ may be excited in a plasma inside the chamber or in a remote plasma region upstream from the chamber. The reactive diluent may be introduced upstream or downstream of the remote plasma such that both $NF_3$ and the reactive diluent (and any plasma-generated effluents) are present in the chamber during cleaning. The presence of the reactive diluent enhances the chamber-cleaning effectiveness of the $NF_3$ which allows less $NF_3$ to be used and discarded. The reactive diluent may also reduce the ability of the $NF_3$ to reform and therefore, further reduce the quantity of discarded $NF_3$. Exemplary chambers may include chemical vapor deposition (CVD) chambers, physical vapor deposition (PVD) chambers, and atomic-layer deposition (ALD) chambers, among other kinds of process chambers.

Figure 1:
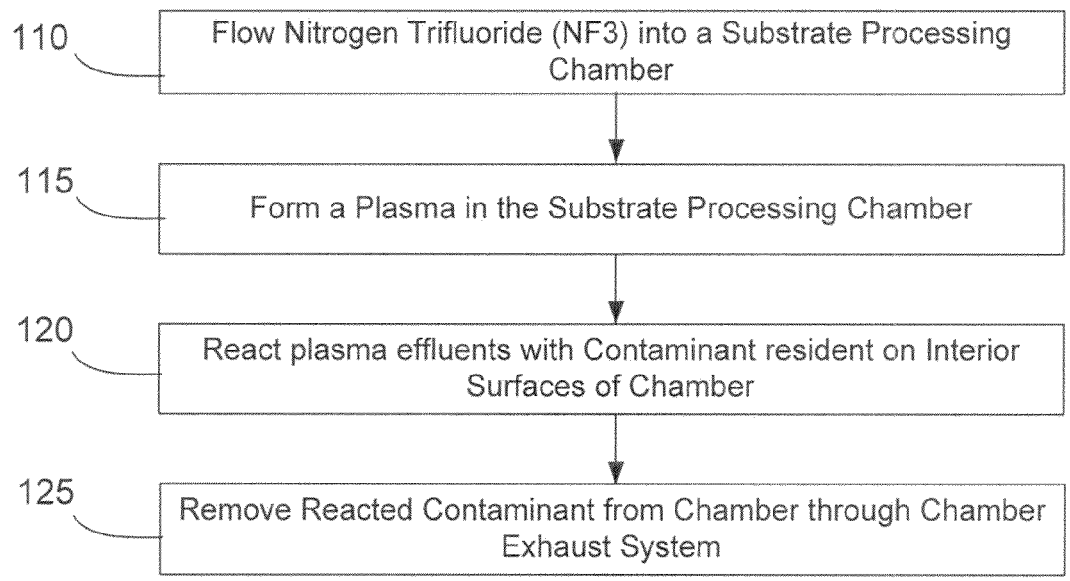
FIG. 1 is a flowchart of a nitrogen trifluoride CVD-chamber-clean process.
Figure 2:
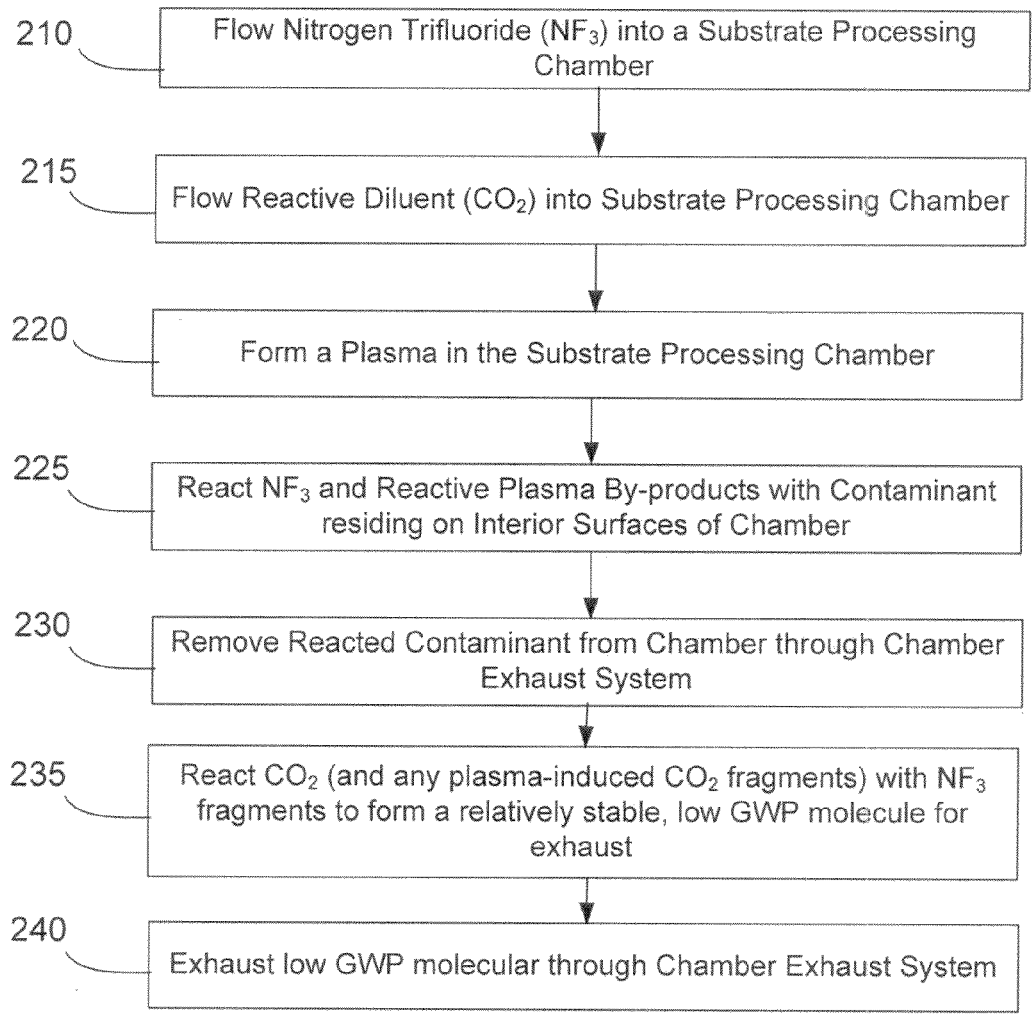
FIG. 2 is a flowchart of a reactive diluent-enhanced nitrogen trifluoride CVD-chamber-clean process according to disclosed embodiments.

In order to better understand and appreciate the invention, reference is now made to FIG. 2, which is a flowchart showing a reactive diluent-enhanced nitrogen trifluoride according to embodiments of the invention. The process may include flowing nitrogen trifluoride into a processing chamber (operation 210). A flow of a reactive diluent ($CO_2$) may be introduced to the processing chamber (operation 215) and a plasma may be formed (operation 220) from the two precursors ($NF_3$ and $CO_2$) to create plasma effluents. Plasma effluents may react with an undesirable contaminant residing on an interior surface of the chamber (operation 225). The reacted contaminant may be removed from the chamber through the chamber exhaust system (operation 230). $CO_2$ and its plasma effluents may react with $NF_3$ fragments to form non-$NF_3$ emission products which may have a lower global warming potential (GWP) than $NF_3$ in operation 235. The non-$NF_3$ emission products may also be removed from the chamber through the chamber exhaust system. The presence of the reactive diluent reduces the amount of $NF_3$ entering the exhaust system for a similar amount of contaminant removed. The reduction is in comparison to the $NF_3$ produced in an otherwise-similar cleaning procedure, such as the procedure shown in FIG. 1.

A variety of reactive diluents can be used to recombine with $NF_3$ fragments, thereby reducing the amount of $NF_3$ which enters the exhaust system. For example, a reactive diluent may contain one or more precursors selected from $CO$, $CO_2$, $H_2O$, $SO_2$, $H_2$, and $O_2$, and saturated or unsaturated hydrocarbons having two to four carbons ($C_2$-$C_4$ hydrocarbons), among other precursors. Exemplary $C_2$ hydrocarbons include $C_2H_2$ and $C_2H_4$, and $C_3$ hydrocarbons include $C_3H_4$ and $C_3H_5$. The plasma may be in the substrate processing chamber or upstream from the chamber in a remote plasma region. It should be appreciated that some molecules which are thought of as non-reactive or inert under room temperature and pressure ambient conditions (e.g., $CO_2$) may be considered reactive diluents under the conditions inside the chamber and/or remote plasma region during an operation.

The reactive diluent may be introduced downstream from the remote plasma region such that, in essence, only the $NF_3$ passes through plasma excitation in embodiments of the invention. Plasmas may also be present in both regions. In some embodiments, a hot surface such as a filament is used in place of a plasma in any of the plasma configurations described. The combination of $NF_3$, the reactive diluent and the reactive species formed by the plasma(s) may be referred to as the cleaning mixture. The cleaning mixture may also include a non-reactive gas such as nitrogen ($N_2$), helium (He), neon (Ne) and/or argon (Ar), as well as mixtures thereof. Non-reactive gases may help to statistically reduce the chance for $NF_3$ fragments to recombine and form an $NF_3$ molecule. Some non-reactive gases may also assist in igniting and maintaining the plasma.

Silicon-containing contaminants are typical contaminants which $NF_3$ plasma treatments are intended to remove. The silicon-containing contaminants may include deposits of silicon oxide on interior surfaces of a deposition chamber during a preceding silicon oxide substrate deposition process. Contaminants may also include silicon nitrides, poly-silicons, silicides, silicon oxy-nitrides, and doped silicon glasses, among other contaminants. As noted above, an exemplary processing chamber for use with the cleaning procedures described include a chemical vapor deposition (CVD) chamber. The claimed cleaning methods may find utility for other chambers such as PVD and ALD chambers. A substrate may or may not be present in the deposition chamber during the cleaning procedure. $NF_3$ introduction into the exhaust system may be reduced both by decreasing the amount of $NF_3$ needed to remove a given contaminant and by reducing the recombination of $NF_3$ fragments to form $NF_3$. For the same size and nature of a contaminant, inclusion of a reactive diluent may reduce $NF_3$ emissions to the point where only about 2% by weight of the $NF_3$ provided in the cleaning gas mixture enters the chamber exhaust system. Traditional abatement methods may be performed on any remaining $NF_3$ emissions including combusting the emissions and/or treating them with a water scrubber. Combining the methods described herein with the traditional abatement methods may achieve a further reduction in $NF_3$ released into the atmosphere.

Figure 3:
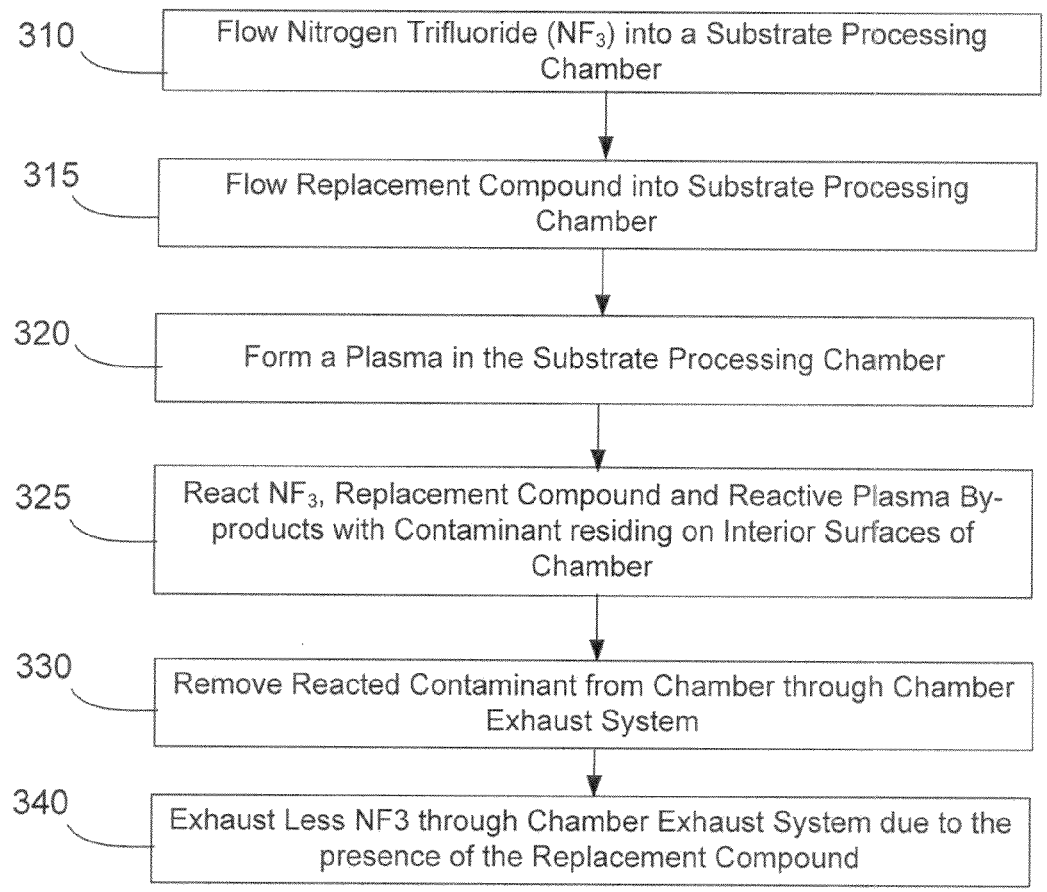
FIG. 3 is a flowchart of a replacement-compound-enhanced nitrogen trifluoride CVD-chamber-clean process according to disclosed embodiments.

Reactive diluents described above were primarily characterized as recombining with $NF_3$ fragments to lessen exhaust of $NF_3$ into the atmosphere. A similar effect can be caused by reducing the amount of $NF_3$ introduced into the plasma (remote or local) and augmenting the cleaning effect by adding a replacement compound. These compounds, to varying degrees, can perform some of the etching functions normally performed by the $NF_3$ plasma effluents. FIG. 3 is a flowchart of a replacement-compound-enhanced nitrogen trifluoride CVD chamber clean according to embodiments of the invention. The cleaning process includes flowing nitrogen trifluoride into the processing chamber (operation 310). A replacement compound is also flowed into the chamber (operation 315) and a plasma is formed (operation 320). Plasma effluents react with contaminants resident on the interior surfaces of the processing chamber (operation 325) and the reacted contaminants are removed through the chamber exhaust system (operation 330). The exhaust carries away less $NF_3$ for a given quantity of removed contaminant (operation 340) as a result of the inclusion of the replacement compound.

A variety of replacement compounds can be used to co-etch the exposed interior surfaces of the chamber in order to ultimately reduce the quantity of $NF_3$ which enters (and exits) the chamber exhaust system. In general, a replacement compound may contain one or more precursors selected from $COF_2$, $IF_5$, $IF_7$, $F_2$, $NCl_2F$, $NF_2Cl$, $NI_2F$, $(CH_3)_2NF$, $(CF_3)_2NF$, $NOF_2$, $BrF_3$, $IF$ and $ClF$, in embodiments of the inventions. In the case of a chamber plasma, both the $NF_3$ and the replacement compound flow into the processing chamber. When a remote plasma is used, the $NF_3$ flows through the remote plasma but the replacement compound may or may not. In some embodiments, the replacement compound flows into the remote plasma and is excited along with the $NF_3$. The replacement compound may, alternatively, be introduced downstream of the remote plasma but before the $NF_3$ plasma effluents arrive in the processing chamber.

Replacement compounds have been primarily characterized as fulfilling a similar role as $NF_3$ and reactive diluents have been described as preempting an $NF_3$ recombination, and in some instances may also simultaneously generate new etching species. It should be understood that replacement compounds and reactive diluents may each perform some of the desirable function primarily attributed to the other.

EXPERIMENTAL

Figure 4:
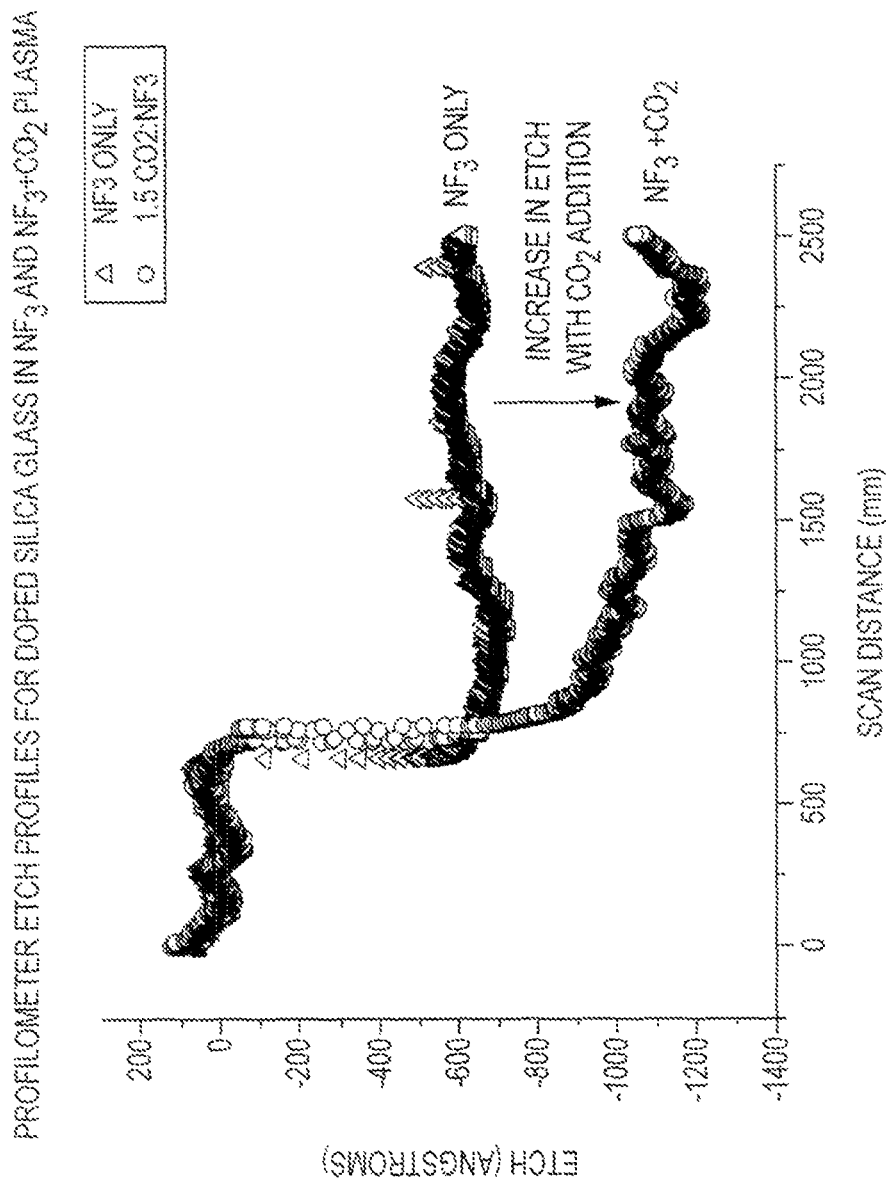
FIG. 4 is a plot comparing etch rates from plasmas of $NF_3$ and $NF_3+CO_2$.

FIG. 4 shows comparative plots of a doped silicon glass etching with plasmas formed from (1) $NF_3$ without $CO_2$ and (2) a combination of $NF_3$ and $CO_2$. The two plots show the $NF_3$ without $CO_2$ resulting in an etching plateau at about 600

Å, while the $NF_3+CO_2$ mixture shows a plateau at about 1200 Å. Thus, FIG. 4 demonstrates the greater etching capability of the $NF_3+CO_2$ mixtures compared with using just $NF_3$ as the etchant.

Figure 5:
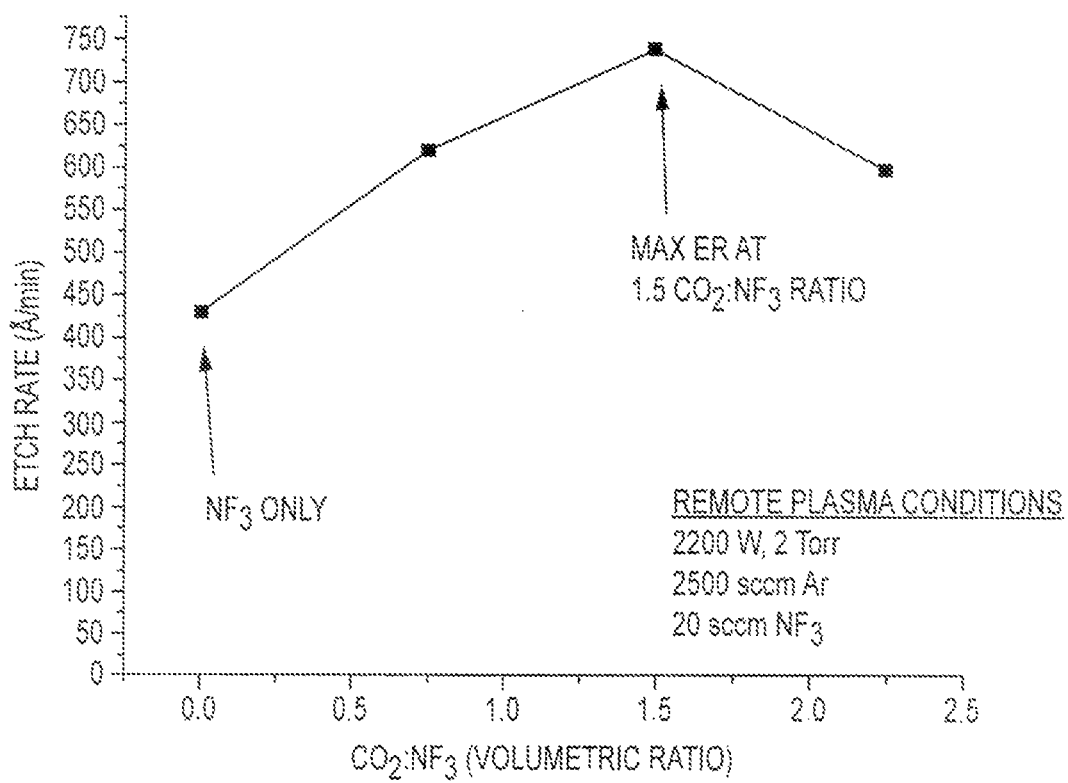
FIG. 5 is a plot showing etch rates from plasmas of $NF_3+CO_2$ at various mixture ratios of $NF_3$ to $CO_2$.

FIG. 5 shows a plot of the etch rate for a doped silicon glass as a function of the volumetric ratio of $CO_2$ to $NF_3$. The far left side of the column shows an etch rate of about 425 Å/min when no $CO_2$ is added to the mixture (e.g., $CO_2$:$NF_3$ is 0). The plot further shows the highest etch rate is achieved for a $CO_2$:$NF_3$ ratio of about 1.5:1. FIG. 5 further establishes that etch gases which include combinations of $NF_3$ and $CO_2$ have a greater etch efficiency than $NF_3$ alone.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. The term "precursor" is used to refer to any process gas which takes part in a reaction to either remove material from or deposit material onto a surface. A gas (or precursor) may be a combination of two or more gases (or precursors) and may include substances which are normally liquid or solid but temporarily carried along with other "matrix gases" or, synonymously, "carrier gases". Matrix gases or carrier gases may be an "inert gas" which refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of cleaning a process chamber with $NF_3$, the method comprising:
    introducing a cleaning mixture to the process chamber, wherein the cleaning mixture consists of a reactive diluent and a fluorinated compound wherein the fluorinated compound includes $NF_3$ and a reactive fluorine-containing species generated from the $NF_3$; and
    reacting the fluorine-containing species generated from the $NF_3$ with a contaminant in the chamber, wherein the reacted contaminant is removed from the chamber, and wherein the reactive diluent increases an etch rate of the cleaning mixture compared to a mixture consisting essentially of $NF_3$ without the diluent.

2. The method of claim 1, wherein the method further comprises forming a non-$NF_3$ emission product from a reaction of the reactive diluent with the reactive fluorine-containing species generated from the $NF_3$.

3. The method of claim 1, wherein the cleaning mixture forms a plasma in the chamber, and the fluorine-containing species is generated in the plasma.

4. The method of claim 1, wherein the reactive fluorine-containing species generated from the $NF_3$ in the cleaning mixture was generated by exposing the $NF_3$ to a remote plasma prior to the cleaning mixture entering the chamber.

5. The method of claim 1, wherein the reactive diluent comprises a $C_2$-$C_4$ hydrocarbon.

6. The method of claim 1, wherein the reactive diluent comprises carbon monoxide.

7. The method of claim 1, wherein the reactive diluent comprises carbon dioxide, water, or sulfur dioxide.

8. The method of claim 1, wherein the reactive fluorine-containing species is selected from the group consisting of, $NF_2$, NF, F and mixtures thereof.

9. The method of claim 1, further comprising introducing a non-reactive gas that does not react with the reactive fluorine-containing species.

10. The method of claim 9, wherein the non-reactive gas comprises He, Ne, Ar, or $N_2$.

11. The method of claim 1, wherein the contaminant comprises a silicon-containing species.

12. The method of claim 1, further comprising introducing a replacement compound into the process chamber wherein said replacement compound is selected from the group consisting of $COF_2$, $IF_5$, $IF_5$, $F_2$, $NCl_2F$, $NF_2Cl$, $NI_2F$, $(CH_3)_2NF$, $(CF_3)_2NF$, $NOF_2$, $BrF_3$, IF, ClF and mixtures thereof.

* * * * *